(12) United States Patent
Ehrenpfordt

(10) Patent No.: US 9,105,649 B2
(45) Date of Patent: Aug. 11, 2015

(54) SEMICONDUCTOR COMPONENT AND CORRESPONDING PRODUCTION METHOD

(75) Inventor: Ricardo Ehrenpfordt, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 164 days.

(21) Appl. No.: 13/577,761

(22) PCT Filed: Dec. 20, 2010

(86) PCT No.: PCT/EP2010/070278
§ 371 (c)(1),
(2), (4) Date: Oct. 29, 2012

(87) PCT Pub. No.: WO2011/098187
PCT Pub. Date: Aug. 18, 2011

(65) Prior Publication Data
US 2013/0193530 A1 Aug. 1, 2013

(30) Foreign Application Priority Data

Feb. 9, 2010 (DE) .......................... 10 2010 001 711

(51) Int. Cl.
*H01L 29/84* (2006.01)
*H01L 21/56* (2006.01)
(Continued)

(52) U.S. Cl.
CPC ............ *H01L 21/565* (2013.01); *B81B 7/0048* (2013.01); *H01L 21/563* (2013.01); *H01L 23/315* (2013.01); *H01L 23/3121* (2013.01); *H01L 24/32* (2013.01); *H01L 24/83* (2013.01); *H01L 25/0655* (2013.01); *H01L 25/16* (2013.01); *H01L 29/84* (2013.01); *B81C 2203/0154* (2013.01); *H01L 24/48* (2013.01);
(Continued)

(58) Field of Classification Search
CPC ............... H01L 2924/00; H01L 2224/48091; H01L 2924/15311; H01L 21/565; H01L 29/84; H01L 2924/10253; H01L 2924/01068; H01L 2924/01023; H01L 2924/01005; H01L 2924/18165; H01L 2924/15151; H01L 2224/48137; H01L 2224/48145; H01L 2224/83001
USPC .......... 257/415, 783, 737, 704; 438/118, 122; 361/704; 29/837
See application file for complete search history.

(56) References Cited

U.S. PATENT DOCUMENTS 5,659,198 A * 8/1997 Okutomo et al. ............. 257/659
6,335,224 B1 * 1/2002 Peterson et al. ............. 438/114
(Continued)

FOREIGN PATENT DOCUMENTS

CN 1449036 A 10/2003
CN 101091245 A 12/2007
(Continued)

OTHER PUBLICATIONS

International Search Report corresponding to PCT Application No. PCT/EP2010/070278, mailed Nov. 2, 2011 (German and English language document) (7 pages).

*Primary Examiner* — Mohammed Shamsuzzaman
(74) *Attorney, Agent, or Firm* — Maginot, Moore & Beck LLP

(57) ABSTRACT

A semiconductor component includes a substrate, a molded package, and a semiconductor chip. The semiconductor chip is suspended on the molding compound above the substrate in the molded package in such a way that a cavity mechanically decouples the semiconductor chip from the substrate. The cavity extends along an underside facing the substrate.

5 Claims, 5 Drawing Sheets

(51) Int. Cl.
 *B81B 7/00* (2006.01)
 *H01L 23/31* (2006.01)
 *H01L 23/00* (2006.01)
 *H01L 25/065* (2006.01)
 *H01L 25/16* (2006.01)

(52) U.S. Cl.
 CPC ......... *H01L 2224/32245* (2013.01); *H01L 2224/48091* (2013.01); *H01L 2224/48137* (2013.01); *H01L 2224/48145* (2013.01); *H01L 2224/48247* (2013.01); *H01L 2224/73265* (2013.01); *H01L 2224/83001* (2013.01); *H01L 2224/838* (2013.01); *H01L 2224/83191* (2013.01); *H01L 2224/92247* (2013.01); *H01L 2225/0651* (2013.01); *H01L 2225/06506* (2013.01); *H01L 2924/0102* (2013.01); *H01L 2924/01005* (2013.01); *H01L 2924/01023* (2013.01); *H01L 2924/01029* (2013.01); *H01L 2924/01058* (2013.01); *H01L 2924/01068* (2013.01); *H01L 2924/01077* (2013.01); *H01L 2924/01082* (2013.01); *H01L 2924/10253* (2013.01); *H01L 2924/15151* (2013.01); *H01L 2924/18165* (2013.01)

(56) References Cited

U.S. PATENT DOCUMENTS

| | | | | |
|---|---|---|---|---|
| 6,493,229 | B2* | 12/2002 | Akram et al. | 361/704 |
| 6,821,819 | B1* | 11/2004 | Benavides et al. | 438/122 |
| 7,475,597 | B2* | 1/2009 | Brida et al. | 73/715 |
| 7,661,318 | B2* | 2/2010 | Brosh et al. | 73/715 |
| 7,692,288 | B2* | 4/2010 | Zhe et al. | 257/704 |
| 7,781,852 | B1* | 8/2010 | Faheem et al. | 257/419 |
| 8,253,258 | B2* | 8/2012 | Sonobe et al. | 257/783 |
| 8,334,158 | B2* | 12/2012 | Takahata et al. | 438/51 |
| 8,748,231 | B2* | 6/2014 | Logan et al. | 438/118 |
| 2004/0064941 | A1* | 4/2004 | Dozier et al. | 29/837 |
| 2006/0237806 | A1* | 10/2006 | Martin et al. | 257/415 |
| 2008/0022777 | A1* | 1/2008 | Tan et al. | 73/718 |
| 2008/0157301 | A1* | 7/2008 | Ramakrishna et al. | 257/676 |
| 2009/0001553 | A1* | 1/2009 | Pahl et al. | 257/704 |
| 2009/0278215 | A1* | 11/2009 | Baldo et al. | 257/415 |
| 2010/0109103 | A1* | 5/2010 | Tsao | 257/418 |
| 2010/0252923 | A1* | 10/2010 | Watanabe et al. | 257/737 |

FOREIGN PATENT DOCUMENTS

| | | |
|---|---|---|
| DE | 10 2006 026 881 A1 | 12/2007 |
| EP | 1 717 562 A1 | 11/2006 |
| WO | 2006/036250 A1 | 4/2006 |

* cited by examiner

SEMICONDUCTOR COMPONENT AND CORRESPONDING PRODUCTION METHOD

This application is a 35 U.S.C. §371 National Stage Application of PCT/EP2010/070278, filed on Dec. 20, 2010, which claims the benefit of priority to Ser. No. DE 10 2010 001 711.6, filed on Feb. 9, 2010 in Germany, the disclosures of which are incorporated herein by reference in their entirety.

BACKGROUND

The present disclosure relates to a semiconductor component and to a corresponding production method.

Although applicable to any semiconductor components, the present disclosure and the problem which it is intended to solve will be explained with reference to a micromechanical pressure sensor.

DE 10 2006 026 881 A1 discloses a mounting concept for an absolute pressure sensor in open cavity full mold technology. In this mounting concept, a chip is fastened on a lead frame, wire-bonded and injection molded around with a molding compound in such a way that the sensor chip partly protrudes from the molding compound. The sensor membrane lies in the part around which injection molding is not carried out.

Conventionally, micromechanical sensor devices are packaged in molded housings made of plastic. On the one hand, so-called leaded housings are used in this case, which comprise curved contact feet for contacting the next plane and fully encapsulate the chip or chips. On the other hand, there are so-called overmolded leadless housings, which are distinguished by the lack of contact limbs. The contacting of the next plane is in this case carried out via contact surfaces on the lower side of the package. The basic system of these molded package variants generally consists of a substrate (Cu, FR4), an adhesive, the silicon chip or chips and the molding compound.

Another package variant consists of expensive premold housings. These are prefabricated injection-molded base housings which are closed with a cover after positioning and contacting of the semiconductor chips. The premold housings constitute a low-stress form of package since there is no direct contact between the assembly partners silicon and molding compound. Furthermore, the cavity existing inside the package, together with an opening in the package, are advantageous and expedient for the media accesses, such as are required for example for pressure sensors, IR sensors and microphones.

With respect to the cost aspect, attempts have been made to produce media accesses and cavities in full mold packages (fully encapsulated) as well. In a first concept, the so-called film mold method is used. In this case, the media access is produced by means of the shape of the molding tool. A projecting tool structure is placed directly on the semiconductor chip and prevents overmolding in this region, for example in the region of a pressure sensor membrane. For tolerance compensation, the molding tool is coated with an ETFE film (ETFE=ethylene-tetrafluoroethylene). The latter is highly deformable and lies geometrically accurately over the tool surface. In this method, there is a direct dependency between the sensor layout and the tool structures. The tool must cover the active membrane structures, but without covering pad surfaces or wire bonds. It is therefore necessary to comply with certain design rules. Furthermore, depending on the layout, full placement of the tool on the active structures, for example membranes, may also be necessary and lead to mechanical stresses. With this method, it is not possible to produce undercuts in the cavities.

Another concept is based on the use of a laminate-based substrate in conjunction with contacting by means of flipchip and underfill technology. The mechanical and electrical contact of the sensor with the substrate is in this case established by solder balls or studbumps and an underfill. The pressure sensor membrane remains uncovered and receives the media access through an opening in the substrate. Above all, however, the point of the underfill proves critical. In order not to cover the membrane with the underfill, the breaking capillary effect on the edge of a substrate opening is employed. The size and edge shape of the opening are therefore indirectly coupled with the flow path of the underfill (and vice versa) and therefore the function of the sensor membrane. Furthermore, the underfill in the meniscus formed is drawn toward the membrane and therefore takes up unused sensor surface area.

FIGS. 9a,b are cross-sectional views of an exemplary semiconductor component in the form of a micromechanical pressure sensor arrangement, FIG. 9b representing a detail enlargement of the region A of FIG. 9.

In FIGS. 9a,b, reference SUB denotes a circuit board substrate, onto which an analysis chip 3 and a micromechanical pressure sensor chip 5 are applied by means of solder balls LK. Underneath the micromechanical pressure sensor chip 5, an underfill U is provided, which serves for mechanical stabilization. The two chips 3, 5 are packed in a molded package 8 consisting of molding compound or pressing compound. The membrane region M of the pressure sensor chip 5 is kept free of underfill U, because an opening L is provided in the substrate at the corresponding position. As can be seen from FIG. 9b, the underfill U forms a meniscus MIN between the edge on the opening L and the micromechanical pressure sensor chip 5, which leads to an increased space requirement.

SUMMARY

The semiconductor component and the corresponding production method, have the advantage over the known solution approaches that a simple, economical and stress-decoupling structure is made possible.

The idea on which the present disclosure is based consists in providing the bonding material on the wafer level and subsequent selective removal of the bonding material relative to the substrate, molded package and semiconductor chip on the component level or module level, so that the semiconductor chip is suspended in the molded package above the substrate in such a way that a cavity, in which no liquid or solid medium is provided, mechanically decouples the semiconductor chip from the substrate. Direct stresses between the semiconductor chip and the substrate can therefore no longer occur. The semiconductor chip remains stably coupled merely to the assembly partner of the molding compound in the molded package.

Additional advantageous refinements and improvements of the respective subject-matter of the disclosure, are described herein.

The present disclosure makes it possible to decouple the assembly system in the molded package and at the same time to produce a cavity as a possible media access in the case of micromechanical sensor chips which require such a media access.

In a particularly preferred embodiment, the bonding material is spin-coated onto the lower side of the wafer with the semiconductor chips, which subsequently faces the substrate. After separation of the wafer into individual semiconductor chips, the component application on the substrate can be carried out fully automatically, without an additional adhesive having to be dosed on.

The package according to the disclosure does not require any standard chip bonding technology such as an adhesive or flipchip technique. This leads to a material and cost saving. The process duration of the bonding of the semiconductor chip on the substrate by means of the preferred polymer as a bonding material is only 0.5 to 3 seconds, which is required in order to melt the bonding material. The stress-sensitive semiconductor chip has only one assembly partner, the molding compound, instead of three assembly partners as in the prior art. The remaining assembly partner, the molding compound, is furthermore best adapted to the semiconductor, for example silicon. No structuring of the bonding material is necessary.

The cavity, which is formed by removing the bonding material, may be used not only as a media access but, in particular, also as a free space to compensate for deformations of the assembly, so that such deformations do not affect the semiconductor chip. The height of the cavity between the semiconductor chip and the substrate can be adjusted without great outlay by means of the thickness of the applied bonding material layer and the component application parameters of the automatic component applicator device.

Particularly for a semiconductor component in the form of a pressure sensor device, the following further advantages are therefore achieved. No special molding tools are necessary. No layout decouplings (tool/pressure sensor membrane) are therefore necessary, and there is no narrow tolerance chain, for example in the positioning of the sensor chip. The membrane does not need to lie directly over the media access, which leads to better protection of the membrane against particles, light etc. Furthermore, no mechanical stresses of the membrane occur as a result of tool contact. A special molding method, for example film molding, is not necessary and there are no effects, for example membrane edge coverages, due to an underfill. The size of the media access can be selected freely through the layout of the opening of the substrate.

As a selectively removable or decomposable bonding material, it is preferable to use a polymer. Possible polymers which may be envisaged are in particular thermally decomposable polymers, for example polycyclic olefins. These are distinguished by a comparatively low decomposition temperature ≥100° C. They generally decompose without leaving residues into gaseous reaction products, for example $CO_2$, CO and $H_2$. Furthermore, they can be spin-coated and structured like standard coatings.

BRIEF DESCRIPTION OF THE DRAWINGS

Exemplary embodiments of the disclosure are represented in the drawings and explained in more detail in the following description.

FIG. 9b illustrates a detail enlargement of the region A of FIG. 9a.

DETAILED DESCRIPTION

In the figures, references which are the same denote components which are the same or functionally equivalent.

Figure 1:
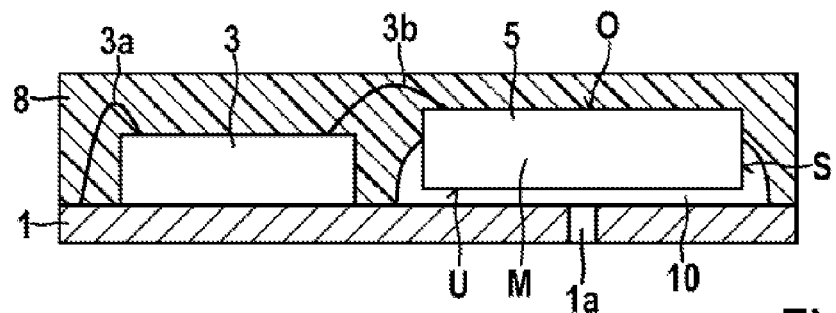
FIG. 1 illustrates a cross-sectional view of a semiconductor component in the form of a micromechanical pressure sensor arrangement according to a first embodiment of the present disclosure.

FIG. 1 is a cross-sectional view of a semiconductor component in the form of a micromechanical pressure sensor arrangement according to a first embodiment of the present disclosure.

In FIG. 1, reference 1 denotes a circuit board substrate on which an analysis chip 3 is applied, which is connected by means of a bonding wire 3a to the substrate 1 and by means of a bonding wire 3b to a micromechanical pressure sensor chip 5. The micromechanical chip 5 is suspended in a molded package consisting of a plastic pressing compound on its upper side O and in a subregion of its lateral side S in direct bonding contact with the silicon, in such a way that a cavity 10 mechanically decouples the micromechanical pressure sensor chip 5 from the substrate.

In other words, the micromechanical pressure sensor chip 5 is not in contact with the substrate 1 on its lower side U and in subregions of its side face S. Only in the region of its upper side O and in the upper region of its lateral sides S is it suspended in the molded package 8. Reference 1a denotes an opening through the substrate 1, which serves as a media access for the micromechanical pressure sensor chip 5. Notably, the membrane region M of the micromechanical pressure sensor chip 5 does not lie directly above the opening 1a, but is arranged laterally offset therefrom so that it is protected against external effects, for example particles, light, handling, etc.

Figure 2:
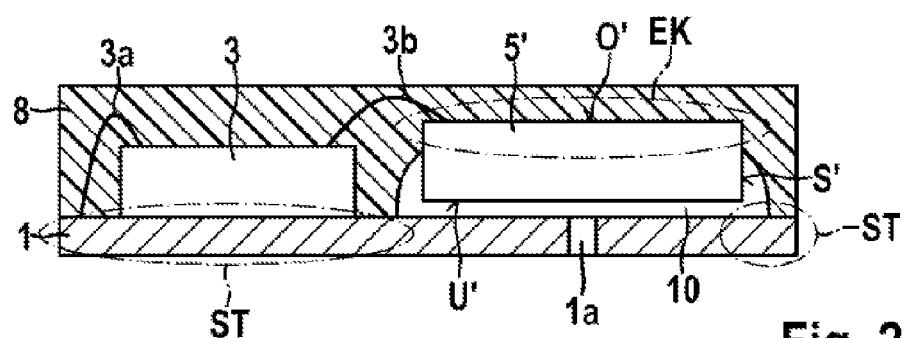
FIG. 2 illustrates a cross-sectional view of a semiconductor component in the form of a rotation rate sensor arrangement according to a second embodiment of the present disclosure.

FIG. 2 is a cross-sectional view of a semiconductor component in the form of a micromechanical rotation rate sensor arrangement according to a second embodiment of the present disclosure.

In the embodiment shown in FIG. 2, instead of the micromechanical pressure sensor chip 5 another micromechanical sensor chip 5' is provided, for example a rotation rate sensor. The suspension by means of its upper side O' and parts of its lateral sides S' in the molded package 8, so as to form the cavity 5 on its lower side U' and the lower parts of its lateral sides S', is similar to the first embodiment according to FIG. 1.

Reference ST denotes regions in which thermally induced stresses can arise. These occur primarily underneath the analysis chip 3, which is connected directly or by means of adhesive or by a flipchip technology to the substrate 1. Conversely, the micromechanical sensor chip 5' remains untouched by it, since it is suspended only in the region EK from the molded package 8, which is thermally mechanically adapted well to silicon.

Figure 3:
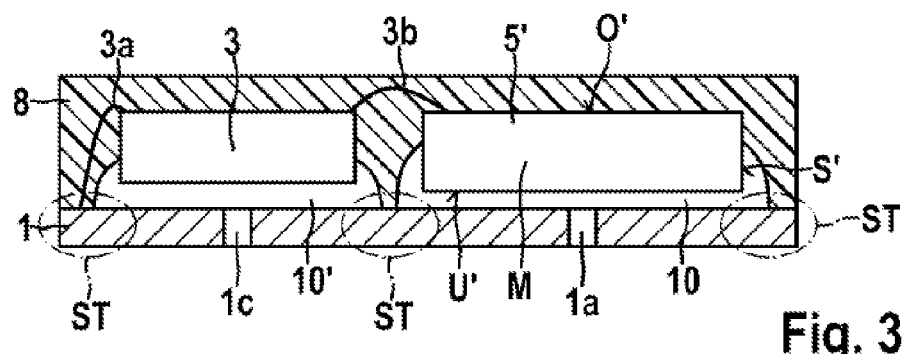
FIG. 3 illustrates a cross-sectional view of a semiconductor component in the form of a micromechanical rotation rate sensor arrangement according to a third embodiment of the present disclosure.

FIG. 3 is a cross-sectional view of a semiconductor component in the form of a micromechanical rotation rate sensor arrangement according to a third embodiment of the present disclosure.

The third embodiment according to FIG. 3 differs from the second embodiment according to FIG. 2 in that the analysis chip 3 is suspended as well in the molding compound of the molded package 8 and a further cavity is provided underneath the analysis chip 3, which decouples the analysis chip 3 mechanically from the substrate 1. The large stressed region ST of FIG. 2 is therefore reduced into two small stressed subregions ST in FIG. 3, although they do not adjoin the analysis chip 3 but merely adjoin the plastic molded package 8, so that the bonding surface between the circuit board and the molded package is reduced.

Additionally provided in the third embodiment according to FIG. 3 is a further opening 1c in the substrate 1 underneath the analysis chip 3. Besides their suitability as a media access, the openings 1a or 1a and 1c in the first to third embodiments described above are also related to the production method of the relevant micromechanical components, as explained below in connection with FIGS. 6 and 7.

Figure 4:
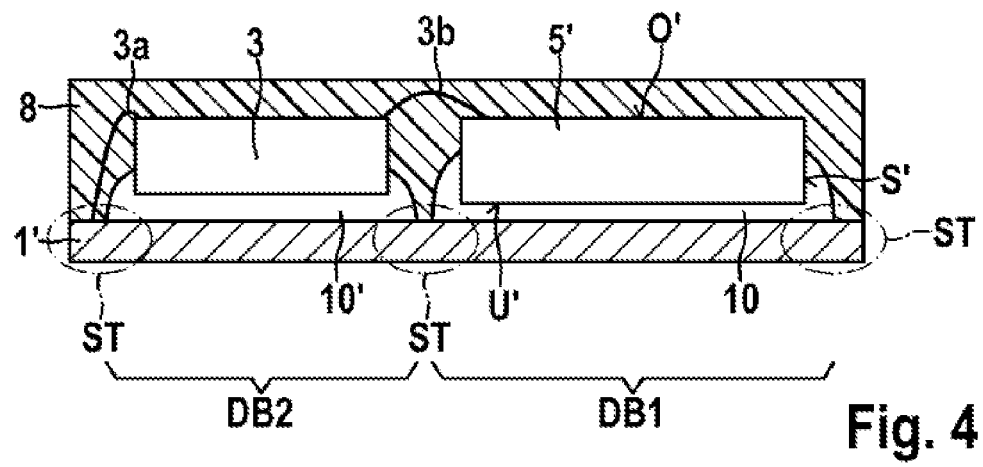
FIG. 4 illustrates a cross-sectional view of a semiconductor component in the form of a micromechanical rotation rate sensor arrangement according to a fourth embodiment of the present disclosure.

FIG. 4 is a cross-sectional view of a semiconductor component in the form of a micromechanical rotation rate sensor arrangement according to a fourth embodiment of the present disclosure.

In the fourth embodiment according to FIG. 4, in contrast to the third embodiment according to FIG. 3, the openings la, lc are not provided in the substrate 1'. Instead, DB1, DB2 denote diffusion regions in the substrate 1', which will be explained in more detail below in connection with the embodiments of the production method according to the disclosure for a semiconductor component.

Figure 5:
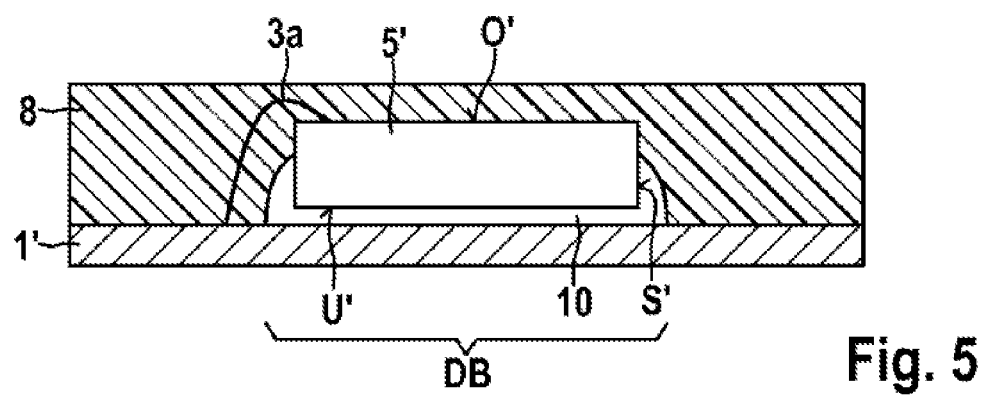
FIG. 5 illustrates a cross-sectional view of a semiconductor component in the form of a micromechanical rotation rate sensor arrangement according to a fifth embodiment of the present disclosure.

FIG. 5 is a cross-sectional view of a semiconductor component in the form of a micromechanical rotation rate sensor arrangement according to a fifth embodiment of the present disclosure.

In the fifth embodiment according to FIG. 5, only a single micromechanical sensor chip, for example a rotation rate sensor, is suspended in the molded package 8 above the substrate 1', which does not have an opening. In FIG. 5, in a similar way to the fourth embodiment according to FIG. 4, reference DB likewise denotes a diffusion region which will be explained below.

Figure 6:
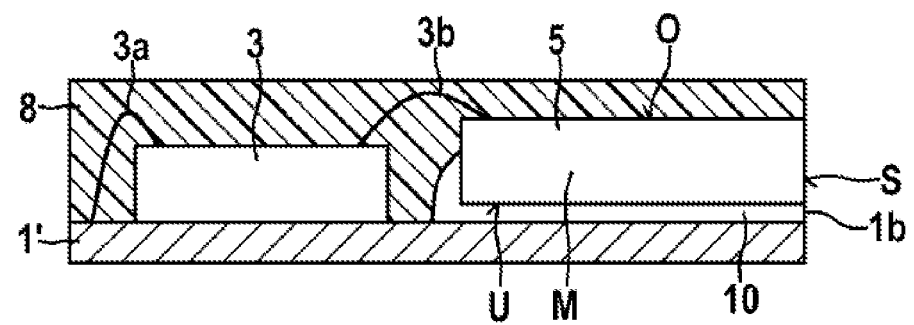
FIG. 6 illustrates a cross-sectional view of a semiconductor component in the form of a micromechanical pressure sensor arrangement according to a sixth embodiment of the present disclosure.

FIG. 6 is a cross-sectional view of a semiconductor component in the form of a micromechanical pressure sensor arrangement according to a sixth embodiment of the present disclosure.

In the sixth embodiment according to FIG. 6, in contrast to the first embodiment according to FIG. 1, an opening 1a is not provided in the substrate 1' but instead there is a lateral access 1b through which the cavity 10 is externally accessible. This lateral access 1b will be explained in more detail in connection with the production method according to FIGS. 7a-d.

FIGS. 7a-d are cross-sectional views of successive process stages in a production method for the semiconductor component according to FIG. 1 according to a seventh embodiment of the present disclosure.

Figure 7A:
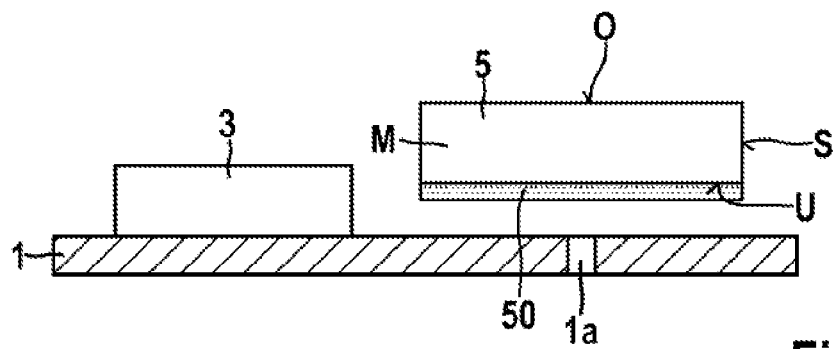
FIGS. 7a-d illustrate cross-sectional views of successive process stages in a production method for the semiconductor component according to FIG. 1 according to a seventh embodiment of the present disclosure.

In the initial process stage according to FIG. 7a, the analysis chip 3 is applied onto the substrate 1, for example by an adhesive bonding technique. This is done in a component assembly for a multiplicity of components on the substrate 1.

In the last process step of the wafer processing before the sawing, the micromechanical pressure sensor chip 5 receives a polymer layer 50 of a polycyclic olefin by spin coating on its lower side U, which subsequently faces the substrate 1. The layer thickness of the bonding material 50 in conjunction with the bonding parameters subsequently determines the height of the cavity 10 produced in the fully processed micromechanical component. After the separation of the wafer with the micromechanical pressure sensor chip 5, a micromechanical pressure sensor chip is applied in the intended mounting region above the opening 1a in the substrate 1.

Figure 7B:
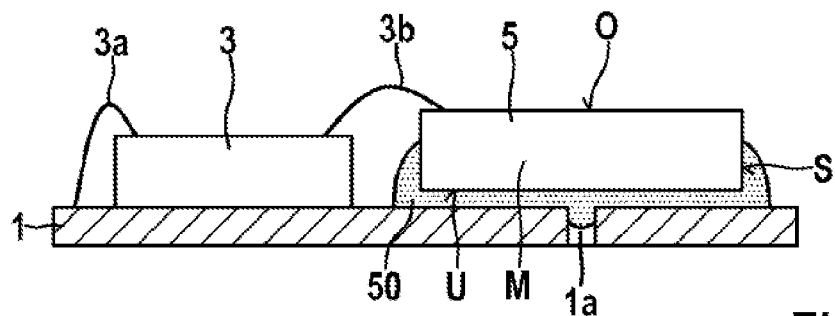
Figure 7C:
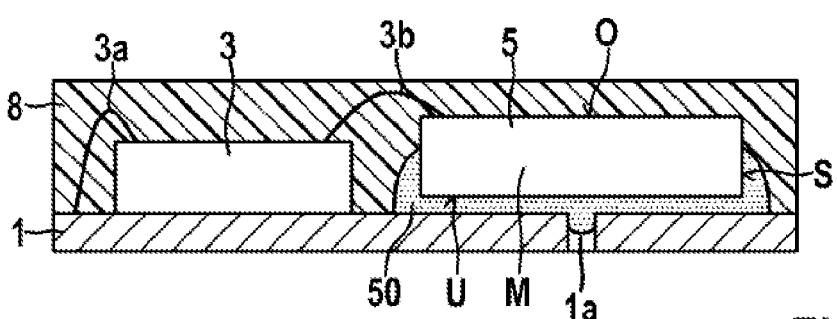
Figure 7D:
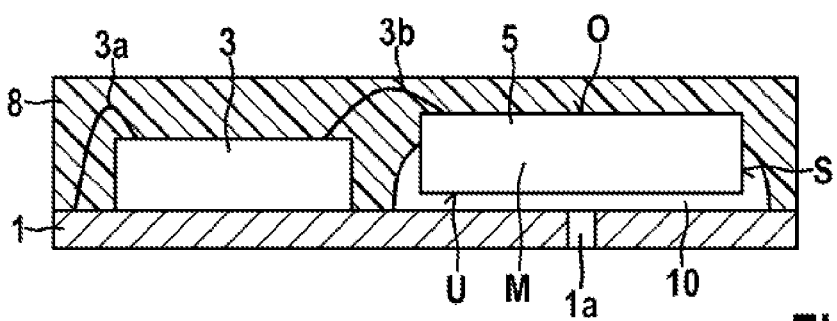

As illustrated in FIG. 7b, bonding with a heated component applicator device is carried out during the application under defined parameters, for example temperature, force, holding time etc. on the substrate 1, the bonding material 50 being melted. Typical holding times for this lie in the range of 0.5-3 seconds. Use of additional adhesives, together with dispensing and a time-consuming unpacking step of typically one hour, is not necessary. After the subsequent wire bonding of the bonding connections 3a, 3b between the substrate and the analysis chip and between the analysis chip and the pressure sensor chip 5, respectively, the system is molded. This molding process step lasts only about one to two minutes at a temperature of 170° C., the bonding material 50 remaining stable in position and geometrically as a bonding layer between the pressure sensor chip 5 and the substrate 1.

Depending on the layer thickness of the bonding material 50 and the bonding parameters, the bonding with the bonding material 50 leads to slight menisci on the lateral sides S of the micromechanical pressure sensor chip 5.

In a subsequent step, the components are separated by a sawing step.

In the subsequent PMC (post-mold cure) thermal step, in which terminal cross-linking of the molded package 8 is carried out in the standard way, the bonding material 50 is decomposed into gaseous products without leaving residues and can therefore be selectively removed. The resulting gaseous products escape through the opening 1a in the substrate.

Removal of the bonding material 50 after the sawing step has the advantage that a protective function for sensitive chip elements on the lower side U, for example the membrane M, can be fulfilled by the bonding material throughout the mounting process.

If this is not necessary, the removal of the bonding material 50 may also be carried out before the sawing step.

The resulting cavity 10 forms a media access for the pressure sensor chip 5 and, secondly, ensures decoupling of the stress-sensitive pressure sensor chip from the substrate 1. The only remaining bonding partner for the pressure sensor chip 5 is the molding compound of the molded package 8, which is thermally best adapted to silicon. The thermal mismatch and the curvature are significantly reduced by the decoupling from the substrate 1. Furthermore, any deformations from the molded package-substrate assembly are not transmitted, or transmitted only limitedly, to the pressure sensor chip 5 owing to the decoupling. With a sufficiently small molding overcoat over the pressure sensor chip 5, the silicon is furthermore dominant and therefore stress-free.

Although the selective removing of the bonding material 50 was carried out simultaneously with the PMC thermal step in the embodiment described in connection with FIGS. 7a-d, this is of course not absolutely necessary, and it may instead be carried out in a separate thermal step.

With reference to FIGS. 4 and 5, it will furthermore be mentioned that, instead of the openings 1a or 1a and 1c in the substrate, there may also be diffusion regions in the substrate 1', through which the gaseous decomposition products of the bonding material 50 can escape. These diffusion regions DB1, D2, or respectively DB, may either be specially structured regions, or in the case of a strongly diffusion-permeable substrate 1' they may however be quite normal substrate regions which do not differ from their surroundings.

It should furthermore be mentioned that the disclosure is not restricted to thermal decomposition of the bonding material, but also includes chemical and/or physical decomposition, for example using a solvent or an etchant or a plasma.

FIGS. 8a-d are cross-sectional views of successive process stages in a production method for the semiconductor component according to FIG. 6 according to an eighth embodiment of the present disclosure.

Figure 8A:
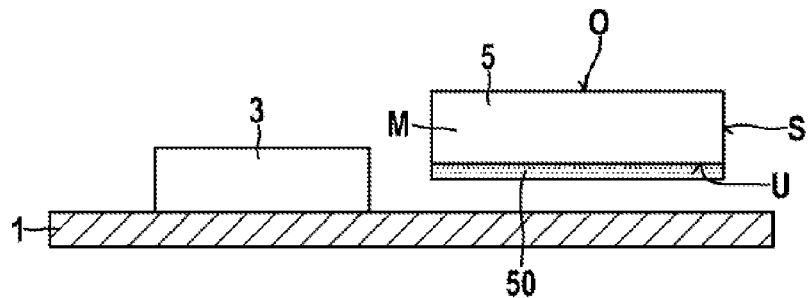
FIGS. 8a-d illustrate cross-sectional views of successive process stages in a production method for the semiconductor component according to FIG. 6 according to an eighth embodiment of the present disclosure.
Figure 8B:
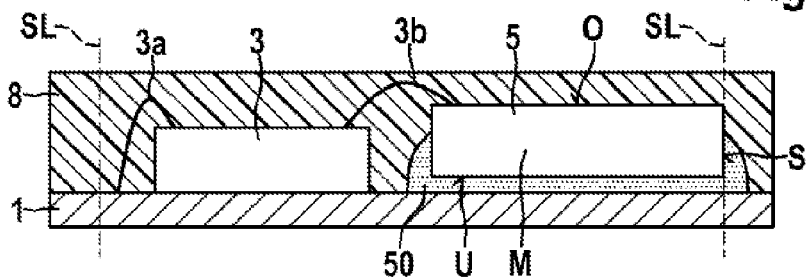

In the embodiment represented in FIGS. 8a-d, the process steps which are represented in FIGS. 8a and 8b correspond to the corresponding process steps according to FIGS. 7a and 7b, which have already been explained above.

Figure 8C:
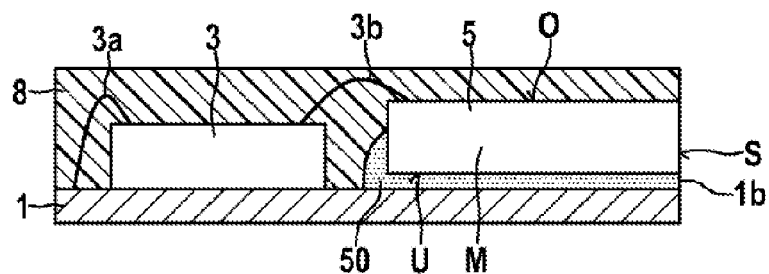
Figure 8D:
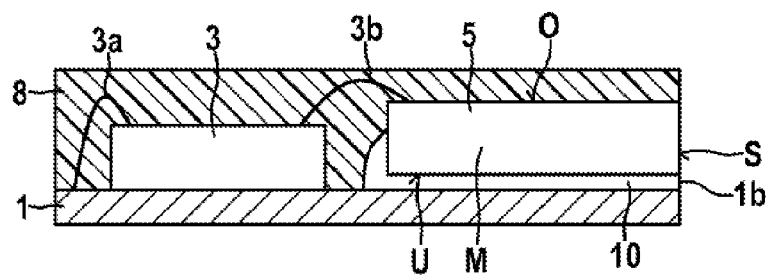
Figure 9A:
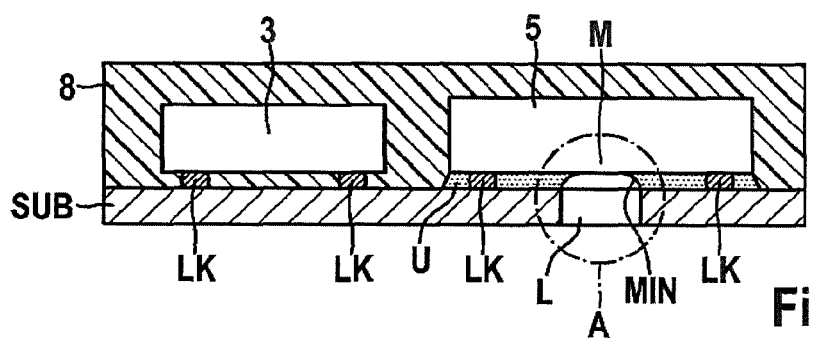
FIG. 9a illustrates a cross-sectional view of an exemplary semiconductor component in the form of a micromechanical pressure sensor arrangement.
Figure 9B:
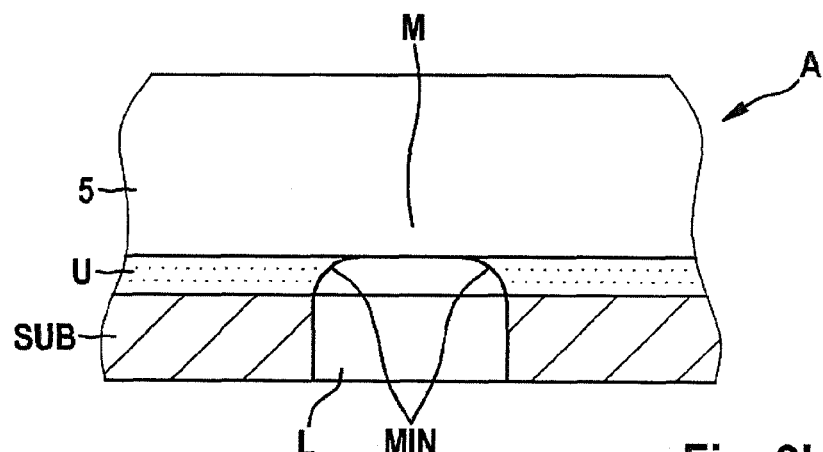

In FIG. 8b, reference SL denotes a sawing line along which a sawing process is carried out in order to reach the process state according to FIG. 8c. During this sawing process, a lateral access 1b to the bonding material 50 is formed. Expediently, the pressure sensor chip 5 is positioned somewhat offset with respect to the sawing line SL before the sawing process, so that a minimal edge region of the lateral side S of the pressure sensor chip is taken off during the sawing.

Following the process state according to FIG. 8c, selective removal of the bonding material 50 is then carried out in order to produce the cavity 10 as in the seventh embodiment described above, either by a thermal process or by a chemical and/or physical process. A stress-decoupled sensor package is therefore achieved with a lateral access 1b for corresponding media, for example atmospheric pressure.

Although the present disclosure has been explained above with the aid of preferred exemplary embodiments, it is not restricted thereto but may also be implemented in other ways.

The disclosure is of course not restricted to the aforementioned micromechanical sensor chips, but may in principle be applied to any semiconductor chips.

The aforementioned polycyclic olefin is only one of many examples of a selectively removable bonding material, and numerous modifications may be envisioned, for example UV-decomposable bonding materials, organically soluble waxes, inorganically soluble substances, etc.

The invention claimed is:

1. A semiconductor component, comprising:
a substrate, a pressure sensor chip and a semiconductor chip;
a molded package of the pressure sensor chip and the semiconductor chip including a molding compound; and
the pressure sensor chip suspended in the molding compound of the molded package above the substrate in such a way that a cavity mechanically decouples the pressure sensor chip from the substrate, wherein an upper side of the pressure sensor chip and a subregion of a lateral side of the pressure sensor chip adjacent to the upper side of the pressure sensor chip are suspended in the molding compound, and wherein the cavity extends along a lower side facing the substrate and the substrate comprises an opening or a diffusion region through which the cavity is externally accessible.

2. The semiconductor component as claimed in claim 1, wherein the cavity extends partially along the lateral side of the semiconductor chip adjacent to the lower side.

3. The semiconductor component as claimed in claim 1, wherein the pressure sensor chip has a membrane region which is arranged on the cavity.

4. The semiconductor component as claimed in claim 1, wherein the semiconductor chip is electrically connected to the pressure sensor chip.

5. The semiconductor component as claimed in claim 4, wherein the semiconductor chip is suspended from the molding compound in the molded package above the substrate in such a way that a further cavity mechanically decouples the semiconductor chip from the substrate.

\* \* \* \* \*